United States Patent
Gabriel

(10) Patent No.: US 6,864,184 B1
(45) Date of Patent: Mar. 8, 2005

(54) METHOD FOR REDUCING CRITICAL DIMENSION ATTAINABLE VIA THE USE OF AN ORGANIC CONFORMING LAYER

(75) Inventor: Calvin T. Gabriel, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/772,830

(22) Filed: Feb. 5, 2004

(51) Int. Cl.$^7$ .......................................... H01L 21/302
(52) U.S. Cl. ............................ 438/725; 216/46
(58) Field of Search ......................... 438/725; 216/46

(56) References Cited

U.S. PATENT DOCUMENTS

| | | | | |
|---|---|---|---|---|
| 4,163,828 A | * | 8/1979 | Mahoney | 428/523 |
| 4,871,630 A | * | 10/1989 | Giammarco et al. | 430/14 |
| 5,064,748 A | * | 11/1991 | Bobbio | 430/311 |
| 5,217,749 A | * | 6/1993 | Denton et al. | 427/488 |
| 6,228,747 B1 | * | 5/2001 | Joyner | 438/436 |
| 6,475,811 B1 | * | 11/2002 | Babcock | 438/1 |
| 6,548,401 B1 | * | 4/2003 | Trivedi | 438/638 |
| 6,750,150 B2 | * | 6/2004 | Chung et al. | 438/706 |
| 2003/0087526 A1 | * | 5/2003 | Huang et al. | 438/694 |
| 2003/0219988 A1 | * | 11/2003 | Shan et al. | 438/725 |

* cited by examiner

Primary Examiner—Matthew Smith
Assistant Examiner—Lex H. Malsawma
(74) Attorney, Agent, or Firm—Renner, Otto, Boisselle & Sklar, LLP

(57) ABSTRACT

In one embodiment, a semiconductor device processing method, comprising the steps of: (a) using a patterned photoresist to form a structure having at least one edge; (b) prior to removal of the photoresist, forming a conforming layer from an organic compound and patterning the conforming layer to form at least one sidewall spacer which are self-aligned to the at least one edge; (c) performing a processing operation which is at least partially localized by the at least one sidewall spacer; and (d) removing the at least one sidewall spacer and the photoresist, wherein the conforming layer is formed via deposition of at least one organic compound selected from $C_1$ to $C_8$ alkanes $C_2$ to $C_8$ alkenes, $C_3$ to $C_8$ cyclo-alkenes, $C_4$ to $C_8$ cyclo-alkenes, $C_1$ to $C_8$ fluoro-alkanes, $C_2$ to $C_8$ fluoro-alkenes, $C_3$ to $C_8$ cyclofluoro-alkanes, $C_4$ to $C_8$ cyclofluoro-alkenes, or mixtures thereof.

21 Claims, 6 Drawing Sheets

METHOD FOR REDUCING CRITICAL DIMENSION ATTAINABLE VIA THE USE OF AN ORGANIC CONFORMING LAYER

FIELD OF THE INVENTION

The present invention relates to semiconductor devices and fabrication methods. More particularly, the present invention relates to methods for forming sidewall spacers in photolithography processes in order to decrease the minimum patterned dimension possible via a photolithography process.

BACKGROUND OF THE INVENTION

A continuing trend in integrated circuit device is the steady shrinkage of device dimensions. This shrinkage has proceeded on a fairly steady exponential curve for many years. The minimum patterned dimension is commonly referred to as the "critical dimension." With conventional MOS technology, as the critical dimension shrinks, the gate oxide becomes thinner, the diffusions become shallower, and the transistor minimum channel length becomes smaller.

As the size of contact and via holes shrink, it has been necessary to use thinner photo-resist. This, in turn, means that a less aggressive oxide etch must be used, so that the photo-resist is not destroyed in the process. Additionally, when using thinner resist, the contact or via etch must have greater selectivity to resist, and this requirement is approaching the limitation of current etches.

As the limits of current lithographic techniques are reached, methods of attaining smaller sized structures have been explored. It is known to use sidewall spacers on masking structures as a means to attain sub-lithographic dimensions. However, this technique has been limited by the fact that the available materials for forming sidewalls require high temperature processing, and their use is thus incompatible with the presence of photo-resist.

It has also been disclosed to use organic materials such as parylene and plasma deposited polymers such as Teflon®, for disposable spacers. One set of processes uses disposable organic spacers made from such compounds in combination with a shallow-trench-isolation pattern, to promote rounding of the trench edge and protection of this edge during subsequent etches. Another set of processes uses disposable organic spacers made from such compounds to decrease the size of contact holes and vias. Since the lithographic size of the hole in the photo-resist can be increased for a given end result, this allows a thicker photo-resist to be used, with the consequent ability to use a more aggressive oxide etch, white decreasing etch selectivity limits. Another set of processes uses disposable organic sidewall spacers made from the compounds listed above in combination with photo-resist to permit alteration of the line-to-space ratio, and to create sub-lithographic structures.

A need exists in the art for a method to form sidewall spacers from a compound which can be deposited using vapor deposition techniques and which can easily be removed during the fabrication process of semiconductor devices.

SUMMARY OF THE INVENTION

In one embodiment, the present invention relates to a semiconductor device processing method, comprising the steps of: (a) using a patterned photoresist to form a structure having al least one edge; (b) prior to removal of the photoresist, forming a conforming layer from an organic compound and patterning the conforming layer to form at least ore sidewall spacer which is self-aligned to the at least one edge; (c) performing a processing operation which is at least partially localized by the at least one sidewall spacer; and (d) removing the at least one sidewall spacer and the photoresist, wherein the conforming layer is formed via deposition of at least one organic compound selected from $C_1$ to $C_8$ alkanes, $C_2$ to $C_8$ alkenes, $C_3$ to $C_8$ cyclo-alkanes, $C_4$ to $C_8$ cyclo-alkenes, $C_1$ to $C_8$ fluoro-alkanes, $C_2$ to $C_8$ fluoro-alkenes, $C_3$ to $C_8$ cyclofluoro-alkanes, $C_4$ to $C_8$ cyclofluoro-alkenes, or mixtures thereof.

In another embodiment, the present invention relates to a method for forming isolation structures, comprising the steps of: (a) forming a patterned masking layer having at least one edge which overlies a substrate containing a body of semiconductor material; (b) forming a conforming layer from an organic compound and patterning the conforming layer to form at least one spacer on the at least one edge of the masking layer; (c) etching the substrate, in areas exposed by the masking layer and the sidewalls, to form said isolation structures; (d) removing the spacers and the patterned masking layer; (e) oxidizing the exposed portions of the semiconductor material; and (f)filling the isolation structures with a dielectric material, wherein the conforming layer is formed via deposition of at least one organic compound selected from $C_1$ to $C_8$ alkanes, $C_2$ to $C_8$ alkenes, $C_3$ to $C_8$ cyclo-alkanes, $C_4$ to $C_8$ cyclo-alkenes, $C_1$ to $C_8$ fluoro-alkanes, $C_2$ to $C_8$ fluoro-alkenes, $C_3$ to $C_8$ cyclofluoro-alkanes, $C_4$ to $C_8$ cyclofluoro-alkenes, or mixtures thereof.

In another embodiment, the present invention relates to a method for forming contacts or vias in an integrated circuit structure, comprising the steps of: (a) forming transistor structures in a substrate which contains a body of semiconductor material; (b) forming a dielectric over the substrate and the transistor structures; (c) depositing and patterning a resist material to form holes there through which expose portions of the dielectric in which contacts or vies are to be formed; (d) forming a conforming layer from an organic compound and patterning the conforming layer to form sidewall spacers on the interior of the holes, whereby the diameter of the holes is reduced; (e) etching the dielectric, in the areas exposed by said holes, to expose an underlying conductive structure; and (f) removing the resist material and the sidewall spacers, wherein the conforming layer is formed via deposition of at least one organic compound selected from $C_1$ to $C_8$ alkanes, $C_2$ to $C_8$ alkenes, $C_3$ to $C_8$ cyclo-alkanes, $C_4$ to $C_8$ cyclo-alkenes, $C_1$ to $C_8$ fluoro-alkanes, $C_2$ to $C_8$ fluoro-alkenes, $C_3$ to $C_8$ cyclofluoro-alkanes, $C_4$ to $C_8$ cyclofluoro-alkenes, or mixtures thereof.

Thus, the present invention overcomes the problems associated with sidewall spacers formed of organic or polymer material which have to be removed via ashing. The present invention also yield a reduction in the minimum patterned dimension or "critical dimension."

DETAILED DESCRIPTION

Figure 1:
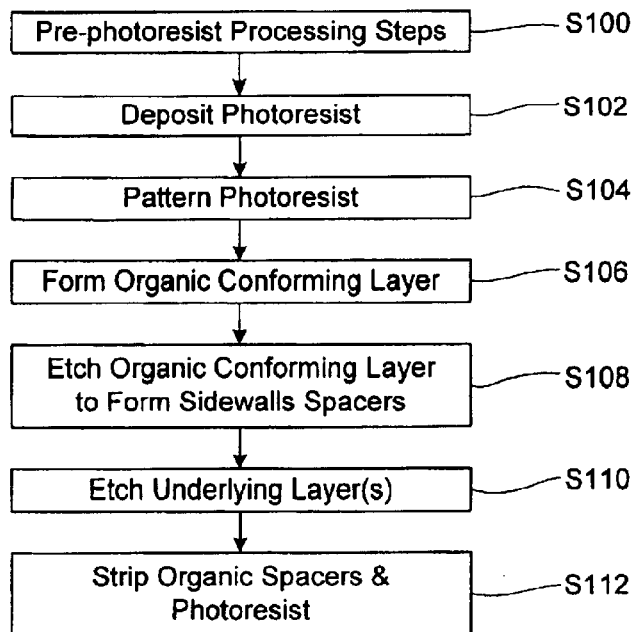
FIG. 1 is a flow chart detailing a process for forming sub-lithographic features via the use of sidewall spacers according to one embodiment of the present invention.
Figure 2A:
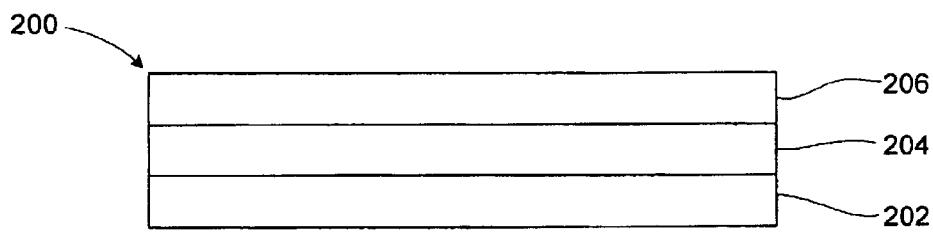
FIGS. 2A to 2F are schematic cross-sectional views of a semiconductor device formed in accordance with the process detailed in the flow chart of FIG. 1.

FIG. 1 is a flowchart detailing a process for forming organic spacers and reducing contact hole dimensions according to the present invention. FIGS. 2A to 2F depict the structure formed v a the process shown in the flowchart of FIG. 1. A layer of photoresist 206 is deposited over one or more underlying layers, any one or more of which are to be patterned. The underlying layer 204 over which a photoresist 206 is deposited is formed on substrate 202 during one or more pre-photoresist processing steps (Step S100). Next the photoresist layer 206 is deposited over underlying layer 204 (Step S102) and the photoresist patterned as desired (Step S104), as is known in the art. As shown in FIG. 2A, only one underlying layer 204 is present on the substrate 202 of semiconductor device 200. However, in another embodiment, more than one underlying layer 204 could be present.

One example of an underlying layer 204 is an oxide layer which is to be patterned via the use of photoresist layer 206. It should be noted that the present invention is not limited to use solely where an oxide layer is to be patterned. Rather, the present invention can be utilized in any situation where smaller critical dimensions are desired, e.g., where smaller critical dimensions are required.

Figure 2B:
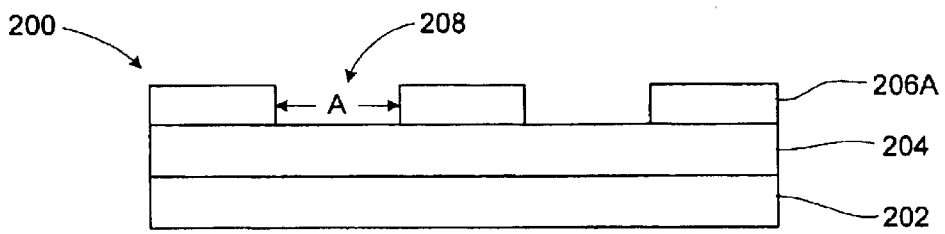

As is shown in FIG. 2B, the patterned layer of photoresist 206a has a pattern formed therein according to processes known to those of skill in the art. In one instance the pattern formed could be for trenches, although any pattern suitable for semiconductor fabrication could be utilized. Thus, the present invention is not applicable to only trench formation. Rather, the present invention can be utilized in a wide variety of situations where sub-lithographic dimensions are desired.

The trenches 208 can be formed to have any desired width (e.g., a width in the range of about 0.05 microns to about 5 microns). As is shown in FIG. 2B, trenches 208 have a width A which typically will be towards the upper resolution limit of the photoresist patterning process.

Next, a conforming layer 210 is formed via any suitable process tram an organic material in Step S106. In one embodiment, the organic material is a hydrocarbon or fluorocarbon which is conformally deposited in Step S106 over the patterned photoresist layer 206a to yield the semiconductor device depicted in FIG. 2C having conforming layer 210. In another embodiment, the organic material is a hydrocarbon or fluorocarbon which is in either a gaseous or vapor state. In one embodiment, the conforming layer 210 is famed from any suitable deposition process as will be explained in detail below.

When the conforming layer 210 is formed from an organic hydrocarbon, compounds such as $C_1$ to $C_8$ alkanes, $C_2$ to $C_8$ alkenes, $C_3$ to $C_8$ cyclo-alkanes, $C_4$ to $C_8$ cyclo-alkenes, or mixtures of two or more thereof are utilized. Examples of such compounds include, but are not limited to, methane, ethane, propanes, butanes, pentanes, ethylene, propylene, butylenes and butadienes.

In another embodiment, the organic layer is formed from a fluorine substituted hydrocarbon. Examples of such fluorocarbons include, but are not limited to, $C_1$ to $C_8$ fluoro-alkanes, $C_2$ to $C_8$ fluoro-alkenes, $C_3$ to $C_8$ cyclofluoro-alkanes, $C_4$ to $C_8$ cyclofluoro-alkenes, or mixtures of two or more thereof. Such compounds have at least one fluorine atom bonded to a carbon atom in place of a hydrogen atom. Some specific examples of such compounds include, but are not limited to, tetrafluoromethane ($CF_4$), trifluoromethane ($CHF_3$), difluoromethane ($CH_2F_2$), fluoromethane ($CH_3F$), hexafluoroethane ($C_2F_6$), tetrafluoroethylene ($C_2F_4$), perfluorocyclobutene ($C_4F_6$), hexafluorobutadiene ($C_4F_6$), perfluorobutene $C_4F_6$) and octafluorocyclobutane ($C_4F_8$).

In one embodiment, at least half of the hydrogens in the aforementioned hydrocarbons have been substituted with fluorine to yield the fluorocarbons utilized in the present invention. In yet another embodiment, at least three-quarters of the hydrogens in the aforementioned hydrocarbons have been substituted with fluorine to yield the fluorocarbons utilized in the present invention. In still another embodiment, all of the hydrogens in the aforementioned hydrocarbons have been substituted with fluorine to yield the fluorocarbons utilized in the present invention.

In another embodiment, the organic hydrocarbon compound used to form conforming layer 210 is selected from any of the compounds listed above and is in a gaseous or liquid state at room temperature (25° C.). In yet another embodiment, when the organic hydrocarbon compound used to form conforming layer 210 is selected from those compounds listed and is in a liquid state at room temperature, the compound selected must have a boiling point near that of water at room temperature. For example, the boiling point of any compound selected should fall any where within the range of about 80° C. to about 120° C.

In one embodiment, the conforming layer 210 is formed to have a thickness of about 10 Angstroms to about 10,000 Angstroms. In another embodiment, the conforming layer 210 is formed so as to have a thickness of about 50 Angstroms to about 5,000 Angstroms. In yet another embodiment, the conforming layer 210 is formed so as to have a thickness of about 100 Angstroms to about 2,000 Angstroms. Additionally, it should be noted that here, as well as elsewhere in the text, ranges may be combined.

Figure 2C:
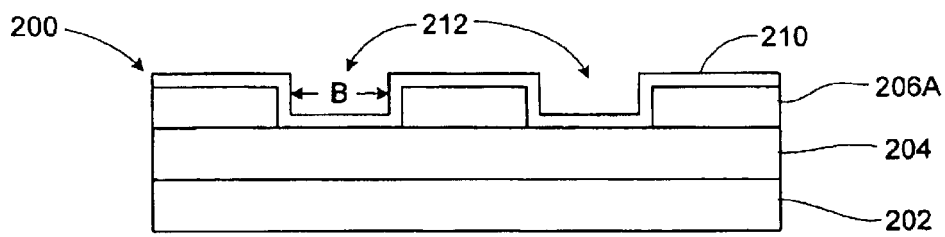
Figure 2D:
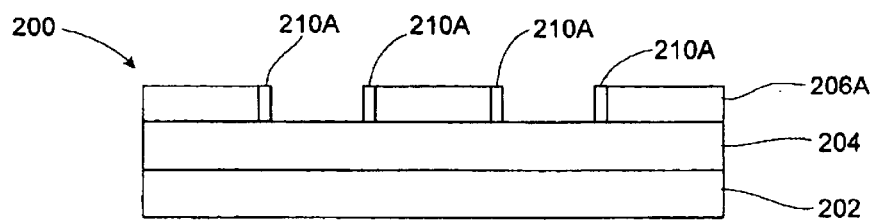

As is shown in FIG. 2C, the conforming layer 210 is deposited both on the horizontal and vertical surfaces of the patterned photoresist 206a. It should be noted that the present invention is not limited to embodiments where only horizontal and vertical surfaces are present. Instead the present invention can be utilized to deposit a conforming layer over a wide variety of patterns, be the patterns trench patterns or other types of semiconductor patterns.

The deposition of conforming layer 210 in the trenches 208 of the patterned photoresist 206a reduces the width of the trenches to width B yielding trenches 212. In one embodiment, width B is not only less than width A, but is also less than the lithographic resolution possible via the patterning process used to pattern photoresist layer 206. In another embodiment, width B is less than width A, but width B is not necessarily less than the lithographic resolution possible via the patterning process used to pattern photoresist layer 206.

In one embodiment, trenches 212 can be formed to have any desired width. For example, the width of trenches 212 can be in the range of about 0.05 microns to about 5 microns.

In one embodiment, the conforming layer 210 is formed via any suitable deposition technique. Such techniques include, for example, chemical vapor deposition (CVD), atomic layer deposition (ALD), plasma enhanced CVD (PECVD), low pressure CVD (LPCVD), atmospheric, pressure CVD (APCVD) and rapid-thermal CVD (RTCVD). In one embodiment, conforming layer 210 is formed via plasma deposition.

When the organic compound being used to form the conforming layer 210 is a gas the rate at the one or more organic compounds are to the reactor is independently from about 1 standard cubic centimeters per minute (sccm) to about 10,000 sccm, or from about 5 sccm to about 1,000 sccm, or even from about 10 sccm to about 100 sccm. In one embodiment, the temperature at which the conforming layer is formed is formed is from about −40 to about 400° C., or from about 0 to about 300° C., or even about 20 to about 150° C. In one embodiment, the pressure in the reactor is from about 1 mTorr to about 760 Torr, or from about 10 mTorr to about 100 Torr, or even from about 20 mTorr to about 10 Torr. If applicable, the bias power used in depositing the conforming layer 210 is about 10 W to about 5000 W, or from about 50 W to about 2,500 W, or even about 100 W to about 1,000 W.

Figure 2E:
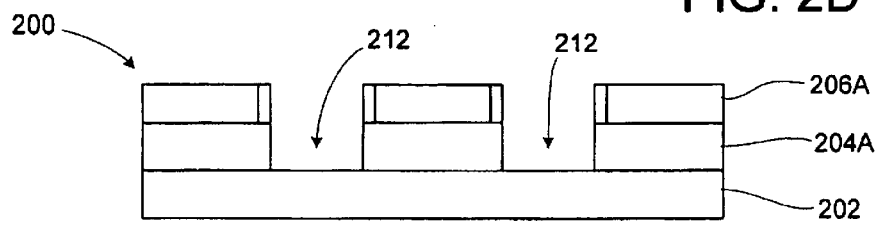
Figure 2F:
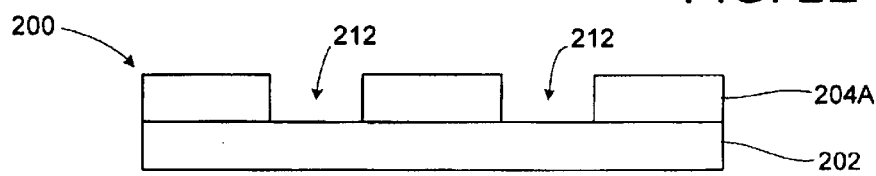

Next in Step S108 conforming film 210 is etched anisotropically to yield sidewall spacers 210a as shown in FIG. 2E. Anisotropic etching processes are known to those of skill in the art, and as such as discussion hereof is omitted for brevity.

Then in Step S110 underlying layer 204 is subjected to an etching process to form patterned layer 204a as is shown in FIG. 2E. In one embodiment, the etching process may be a plasma etching process, however the present invention is not limited to embodiments only utilizing plasma etching of the one or more underlying layers. Depending upon the composition of the one or more underlying layers, those of skill in the art would recognize what etching process can be utilized to "transfer" the pattern created by the combination of the photoresist and organic sidewall spacers to any one or more of the underlying layers.

Once the etching step S110 is complete, the patterned photoresist layer 206a and the sidewall spacers 210a are removed via any suitable technique (Step S112) as is known to those of skill in the art. For example, the photoresist and sidewall spacers can be removed via chemical mechanical polishing (CMP), ashing, etc.

This embodiment of disposable organic spacers can be used during metallization, DRAM capacitor fabrication (to use more of the available area for capacitor fabrication), in non-volatile memory floating gate fabrication, and in general anywhere a relatively low temperature sidewall material (e.g., about −40 to about 400° C.) is desired.

In another embodiment, the present invention can be utilized to form disposable sidewall spacers to be used in trench isolation processes. The benefits of trench isolation, in particular, shallow trench isolation, are known to those of skill in the art.

Figure 3:
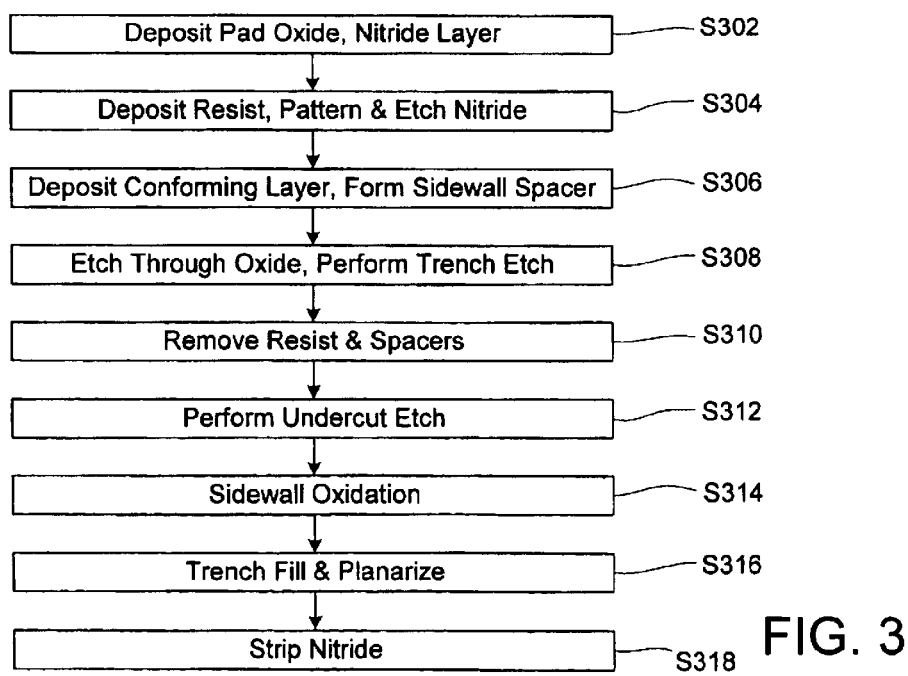
FIG. 3 is a flow chart detailing a shallow trench isolation process which utilizes sidewall spacers according to another embodiment of the present invention.

FIG. 3 is a flow chart of a trench isolation process in which the patterned oxidation barrier (silicon nitride in this case) is non-lithographically modified by a disposable organic sidewall spacer. FIGS. 4A to 4F depict a semiconductor structure 400 formed via the process shown in the flowchart of FIG. 3.

The process of this embodiment begins with growth of a pad oxide 404 on a substrate 402 and deposition (Step S302) of a masking layer 406, which in this example is silicon nitride. A photoresist 408 is deposited over the nitride 406, and patterned to expose areas where trench isolation is desired. The nitride layer 406 is then etched through the photoresist layer 406, with the etch stopping within the oxide layer 404 (Step S304). This yields the semiconductor structure 400 shown in FIG. 4A. A conforming layer of an organic compound, as described, is then deposited and anisotropically etched to form sidewall spacers 410 on the edges of the resist and nitride stack (Step S306). This yields the semiconductor structure shown in FIG. 4B.

Figure 4A:
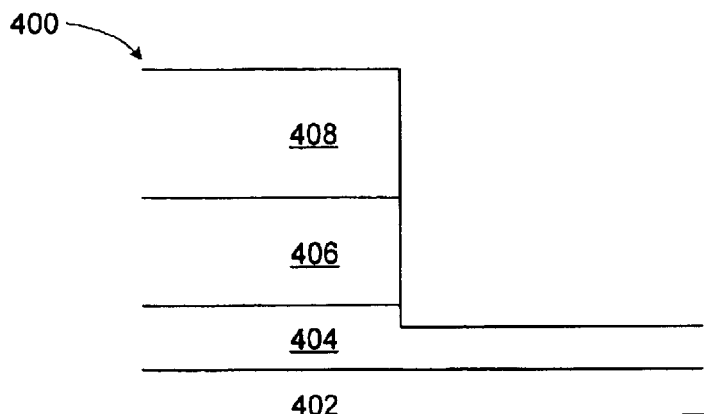
FIGS. 4A to 4F are schematic cross-sectional views of a semiconductor device formed in accordance with the process detailed in the flow chart of FIG. 3.
Figure 4B:
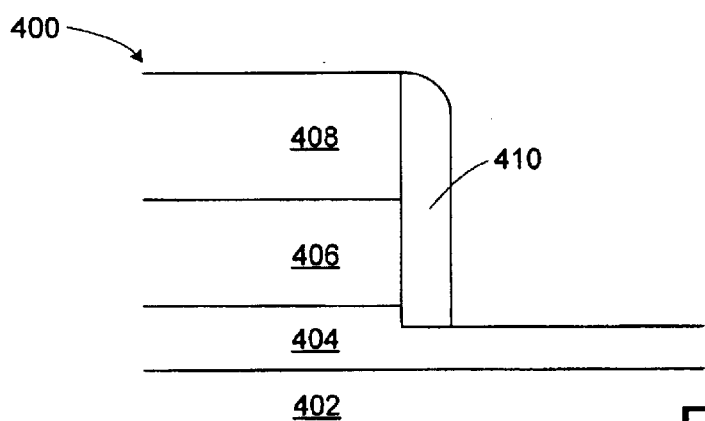
Figure 4C:
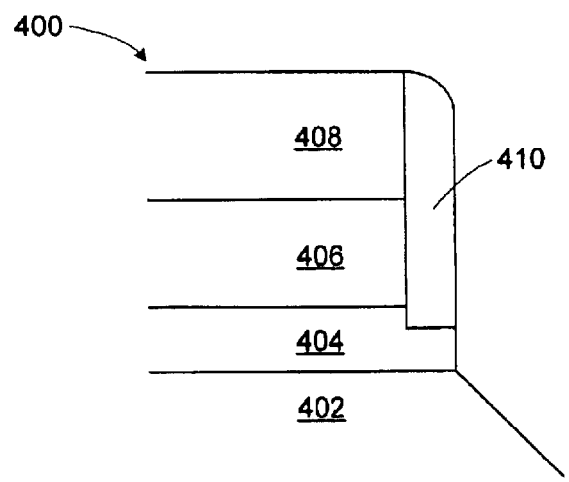
Figure 4D:
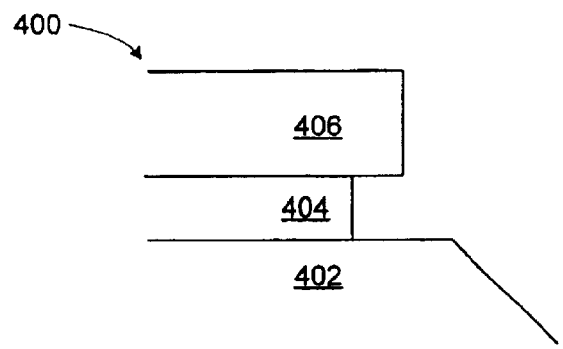
Figure 4E:
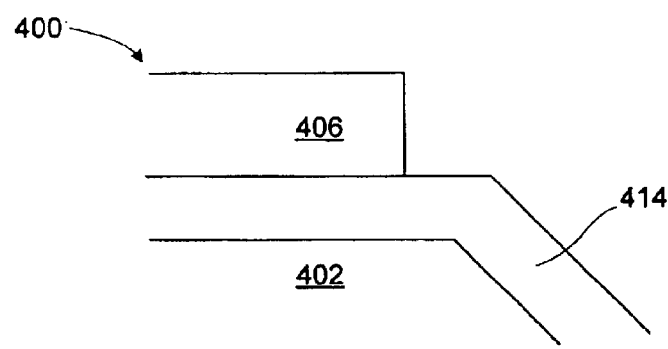
Figure 4F:
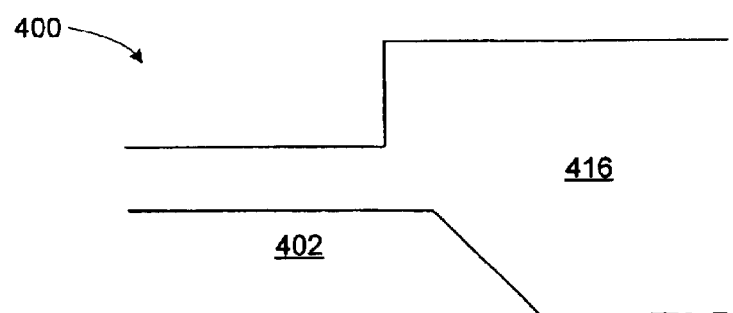

An etch is then performed (Step S308) to go through the oxide 404 and to form the desired trench structure 412 in the substrate 402, as shown in FIG. 4C. The photoresist 408 and spacers 410 are then be removed by any suitable technique (e.g., ashing) in Step S310. Next, a short isotropic oxide etch (Step S312) creates a slight undercut of the oxide layer away from the edge of the trench (see FIG. 4D). An oxidation (Step S314) is performed to grow a thin layer of thermal oxide 414 on the sidewalls of trench 412. As is shown in FIG. 4E, this step will also grow oxide on the substrate area exposed by the removed spacers and by the oxide etch. Because the nitride layer 406 is set back from the edge of the trench 412, a thicker, more rounded thermal oxide 414 is grown at the trench edge, providing greater protection against leakage along this edge. Finally, a layer of oxide 416 is deposited and planarized (Step S316), to fill the trench, followed by stripping the nitride layer (Slop S318) to yield the semiconductor structure 400 of FIG. 4F.

Figure 5:
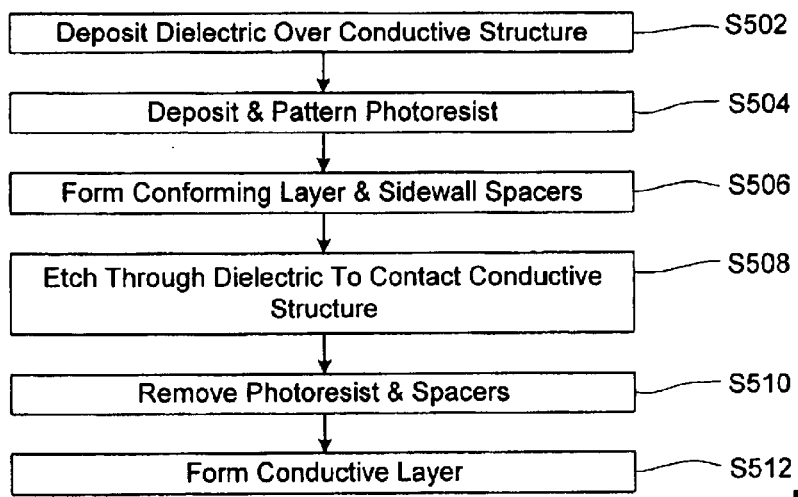
FIG. 5 is a flow chart detailing a process which utilizes sidewall spacers to form vias and/or contacts according to another embodiment of tie present invention.

In yet another embodiment of the present invention, a method is disclosed which is used to create contact or via holes to contact various conductive structures present in different levels of a semiconductor device. FIG. 5 is a flow chart of a process which enables the formation of sub-lithographic contact or via holes, via the use of organic sidewall spacers, for the connection of conductive structures on different levels of a semiconductor structure. FIGS. 6A to 6D depict a semiconductor structure 600 formed via the process shown in the flowchart of FIG. 5.

Figure 6A:
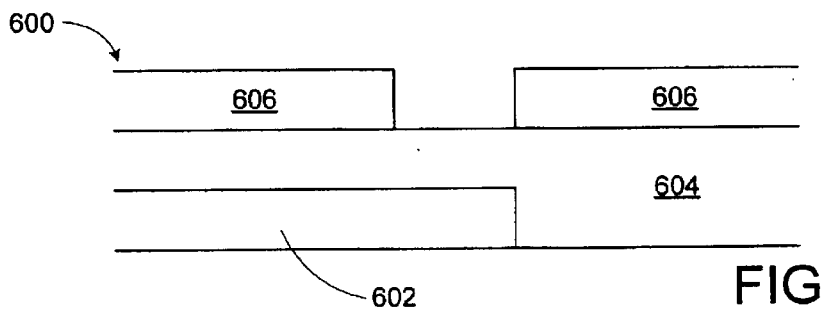
FIGS. 6A to 6D are schematic cross-section views of a semiconductor device formed in accordance with the process detailed in the flow chart of FIG. 5.
Figure 6B:
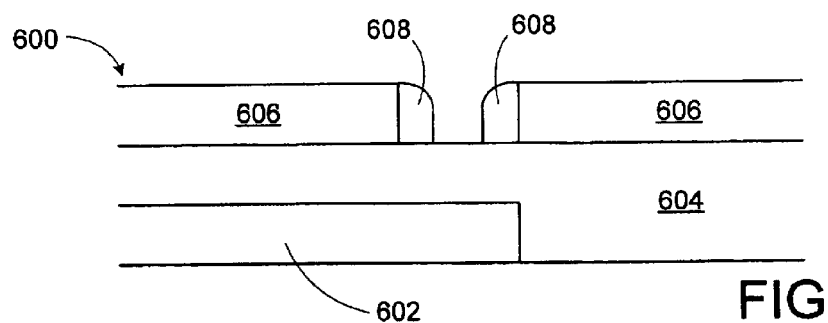

The process of this embodiment begins with Step S502, the deposition of a dielectric layer 604 over one or more conductive structures 602. The conductive structure 602 depicted in FIG. 6A may be part of a transistor, such as a gate or source/drain contact, or may be a metallization layer in the integrated circuit, Photoresist layer 606 is deposited, patterned and developed (Step S504) to expose the dielectric layer 604 at the point of a desired contact or via. As seen in FIG. 6B, a conforming layer of an organic material is deposited in accordance with the above-described process and anisotropically etched (Step S506) to form sidewall spacers 608 on the interior of the resist pattern, effectively reducing the diameter of the hole to be etched.

Figure 6C:
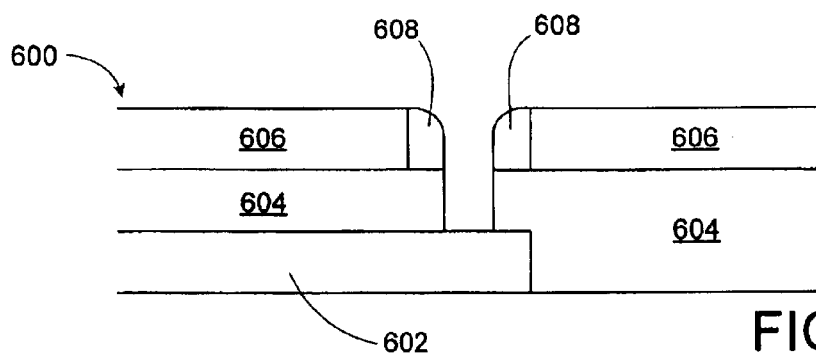
Figure 6D:
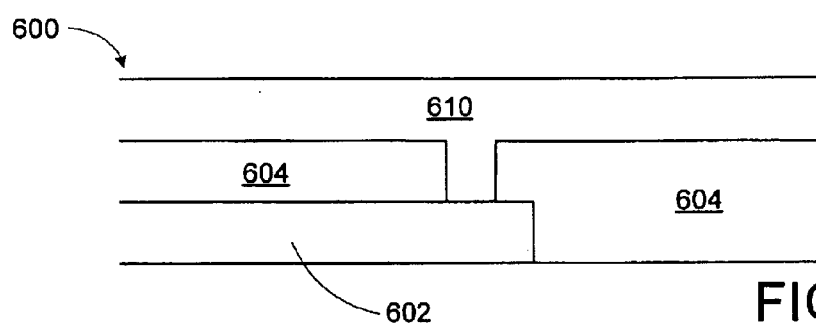

An etch is then performed (Step S508), masked by the photoresist and spacers, to open a hole through the dielectric layer 604 and expose the underlying conductive structure 602, as is seen in FIG. 6C. The photoresist 606 and sidewall spacers 608 are removed via any suitable method (e.g., ashing) in Step S510 and a layer of metal 610 is deposited via any suitable method to fill the contact/via (Step S512), yielding structure 600 as seen in FIG. 6D.

In light of the above, the present invention can be utilized in several ways. For example, organic spacers formed in accordance with any one of the above methods can be used to create sub-lithographic openings, or they may be used to scale down a hole which was created at a larger size in the photoresist to allow use of a thicker resist.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. An A semiconductor device processing method, comprising the steps of:
   (a) using a patterned photoresist to form a structure having at least one edge;
   (b) prior to removal of the photoresist, forming a conforming layer from an organic compound and patterning the conforming layer to form at least one sidewall spacer which is self-aligned to the at least one edge;
   (c) performing a processing operation which is at least partially localized by the at least one sidewall spacer; and
   (d) removing the at least one sidewall spacer and the photoresist wherein the conforming layer is formed via deposition of at least one organic compound selected from $C_1$ to $C_8$ alkanes, $C_2$ to $C_8$ alkanes, $C_3$ to $C_8$ cyclo-alkanes, $C_4$ to $C_8$ cyclo-alkenes, $C_1$ to $C_8$ fluoro-alkanes, $C_2$ to $C_8$ fluoro-alkenes, $C_4$ to $C_8$ cyclofluoro-alkanes $C_4$ to $C_8$ cyclofluoro-alkenes, or mixtures thereof,
   wherein in the patterning the conforming layer to form at least one sidewall spacer, the patterning anisotropically removes substantially all of the conforming layer from surfaces other than the at least one edge.

2. The method of claim 1, wherein the conforming layer is formed from one or more gaseous alkanes, gaseous alkenes, gaseous fluoro-alkanes, gaseous fluoro-alkenes, or mixtures thereof.

3. The method of claim 2, wherein the conforming layer is formed from at least one compound selected from methane, ethane, propanes, butanes, pentanes, ethylene, propylene, butylenes, butadienes, tetrafluoromethane, trifluoromethane, difluoromethane, fluoromethane, hexafluoroethane, tetrafluoroethylene, perfluorocyclobutene, hexafluorobutadiene, perfluorobutene, octafluorocyclobutane, or mixtures thereof.

4. The method of claim 1, wherein the conforming layer is formed via a deposition process selected from chemical vapor deposition, atomic layer deposition, plasma enhanced chemical vapor deposition, low pressure chemical vapor deposition, atmospheric pressure chemical vapor deposition, or rapid-thermal chemical vapor deposition.

5. The method of claim 1, wherein the conforming layer is formed via plasma deposition.

6. The method of claim 5, wherein the plasma deposition is conducted at a temperature in the range of about −40 to about 400° C.

7. The method of claim 5, wherein the plasma deposition is conducted at a power in the range of about 10 W to about 10,000 W.

8. A method for forming isolation structures, comprising the steps of:
   (a) forming a patterned masking layer having at least one edge which overlies a substrate containing a body of semiconductor material;
   (b) forming a conforming layer from an organic compound and patterning the conforming layer to form at least one spacer on the at least one edge of the masking layer;
   (c) etching the substrate, in areas exposed by the masking layer and the sidewalls, to form said isolation structures;
   (d) removing the spacers and the patterned masking layer;
   (e) oxidizing the exposed portions of the semiconductor material; and
   (f) filling the isolation structures with a dielectric material,
   wherein the conforming layer is formed via deposition of at least one organic compound selected from $C_1$ to $C_8$ alkanes, $C_2$ to $C_8$ alkenes, $C_3$ to $C_8$ cycle-alkanes, $C_4$ to $C_8$ cycle-alkenes, $C_1$ to $C_8$ fluoro-alkanes, $C_2$ to $C_8$ fluoro-alkenes, $C_3$ to $C_8$ cyclofluoro-alkanes, $C_4$ to $C_8$ cyclofluoro-alkenes, or mixtures thereof.

9. The method of claim 8, wherein the conforming layer is formed from one or more gaseous alkanes, gaseous alkenes, gaseous fluoro-alkanes, gaseous fluoro-alkenes, or mixtures thereof.

10. The method of claim 9, wherein the conforming layer is formed from at least one compound selected from methane, ethane, propanes, butanes, pentanes, ethylene, propylene, butylenes, butadienes, tetrafluoromethane, trifluoromethane, difluoromethane, fluoromethane, hexafluoroethane, tetrafluoroethylene, perfluorocyclobutene, hexafluorobutadiene, perfluorobutene, octafluorocyclobutane, or mixtures thereof.

11. The method of claim 8, wherein the conforming layer is formed via a deposition process selected from chemical vapor deposition, atomic layer deposition, plasma enhanced chemical vapor deposition, low pressure chemical vapor deposition, atmospheric pressure chemical vapor deposition, or rapid-thermal chemical vapor deposition.

12. The method of claim 8, wherein the conforming layer is formed via plasma deposition.

13. The method of claim 12, wherein the plasma deposition is conducted at a temperature in the range of about −40 to about 400° C.

14. The method of claim 12, wherein the plasma deposition is conducted at a power in the range of about 10 W to about 10,000 W.

15. A method for forming contacts or vias in an integrated circuit structure, comprising the steps of:
   (a) forming transistor structures in a substrate which contains a body of semiconductor material;
   (b) forming a dielectric over the substrate and the transistor structures;
   (c) depositing and patterning a resist material to form holes there through which expose portions of the dielectric in which contacts or was are to be formed;
   (d) forming a conforming layer from an organic compound and patterning the conforming layer to form sidewall spacers on the interior of the holes, whereby the diameter of the holes is reduced;
   (e) etching the dielectric, in the areas exposed by said holes, to expose an underlying conductive structure; and
   (f) removing the resist material and the sidewall spacers, wherein the conforming layer is formed via deposition of at least one organic compound selected from $C_1$ to $C_8$ alkanes, $C_2$ to $C_8$ alkenes, $C_3$ to $C_8$ cyclo-alkanes, $C_4$ to $C_8$ cyclo-alkenes, $C_1$ to $C_8$ fluoro-alkanes, $C_2$ to $C_8$ fluoro-alkenes, $C_3$ to $C_8$ cyclofluoro-alkanes, $C_4$ to $C_8$ cyclofluoro-alkenes, or mixtures thereof.

16. The method of claim 15, wherein the conforming layer is formed from one or more gaseous alkanes, gaseous alkenes, gaseous fluoro-alkanes, gaseous fluoro-alkenes, or mixtures thereof.

17. The method of claim 16, wherein the conforming layer is formed from at least one compound selected from methane, ethane, propanes, butanes, pentanes, ethylene, propylene, butylenes, butadienes, tetrafluoromethane, trifluoromethane, difluoromethane, fluoromethane, hexafluoroethane, tetrafluoroethylene, perfuorocyclobutene, hexafluorobutadiene, perfluorobutene, octafluorocyclobutane, or mixtures thereof.

18. The method of claim 15, wherein the conforming layer is formed via a deposition process selected from chemical vapor deposition, atomic layer deposition, plasma enhanced chemical vapor deposition, low pressure chemical vapor deposition, atmospheric pressure chemical vapor deposition, or rapid-thermal chemical vapor deposition.

19. The method of claim 15, wherein the conforming layer is formed via plasma deposition.

20. The method of claim 19, wherein the plasma deposition is conducted at a temperature inthe range of about −40 to about 400° C.

21. The method of claim 19, wherein the plasma deposition is conducted at a power in the range of about 10 W to about 10,000 W.

* * * * *

UNITED STATES PATENT AND TRADEMARK OFFICE
CERTIFICATE OF CORRECTION

PATENT NO. : 6,864,184 B1
DATED : March 8, 2005
INVENTOR(S) : Gabriel

It is certified that error appears in the above-identified patent and that said Letters Patent is hereby corrected as shown below:

Column 1,
Line 53, replace "white" with -- while --

Column 2,
Line 2, replace "al" with -- at --
Line 5, replace "ore"with -- one --
Line 43, replace "vies" with -- vias --

Column 3,
Line 13, replace "tie" with -- the --
Line 23, replace "formed v a the" with -- formed via the --
Line 62, replace "tram" with -- from --

Column 4,
Line 4, replace "farned" with -- formed --

Column 5,
Line 47, replace "210" with -- 210a --
Line 49, replace "as such as" with -- as such a --

Column 6,
Line 29, replace "photoresist layer 406"with -- photoresist layer 408 --
Line 54, replace "(Stop S318)" with -- (Step S318) --

Column 7,
Line 42, replace "An A semiconductor" with -- A semiconductor --
Line 6, replace "circuit," with -- circuit. --
Line 57, replace "$C_2$ to $C_8$ alkanes" with -- $C_2$ to $C_8$ alkenes --
Line 59, replace "$C_4$ to $C_8$" with -- $C_3$ to $C_8$ --

Column 8,
Line 48, replace "cycle-alkanes" with -- cyclo-alkanes --
Line 49, replace "cycle-alkenes" with -- cyclo-alkenes --

UNITED STATES PATENT AND TRADEMARK OFFICE
CERTIFICATE OF CORRECTION

PATENT NO.   : 6,864,184 B1
DATED        : March 8, 2005
INVENTOR(S)  : Gabriel

It is certified that error appears in the above-identified patent and that said Letters Patent is hereby corrected as shown below:

Column 9,
Line 22, replace "or was are" with -- or vias are --

Column 10,
Line 13, replace "perfuorocyclobutene" with -- perfluorocyclobutene --

Signed and Sealed this

Seventh Day of June, 2005

JON W. DUDAS
*Director of the United States Patent and Trademark Office*